United States Patent
Bahlmann et al.

(10) Patent No.: US 11,655,565 B2
(45) Date of Patent: May 23, 2023

(54) METHOD FOR DETERMINING AN ELECTRICAL POWER OR AN ELECTRICAL ENERGY CONSUMPTION OF A SPINNING MACHINE OR WINDER AND A SPINNING MACHINE OR WINDER OPERATING IN ACCORDANCE WITH THE METHOD

(71) Applicant: Maschinenfabrik Rieter AG, Winterthur (CH)

(72) Inventors: Bernd Bahlmann, Schrobenhausen (DE); Martin Zipperer, Beilngries (DE); Franz Huettinger, Geisenfeld (DE); Julian Reuthlinger, Ingolstadt (DE)

(73) Assignee: Maschinenfabrik Rieter AG, Winterthur (CH)

( * ) Notice: Subject to any disclaimer, the term of this patent is extended or adjusted under 35 U.S.C. 154(b) by 240 days.

(21) Appl. No.: 16/998,313

(22) Filed: Aug. 20, 2020

(65) Prior Publication Data

US 2021/0054542 A1 Feb. 25, 2021

(30) Foreign Application Priority Data

Aug. 22, 2019 (DE) ...................... 10 2019 122 609.0

(51) Int. Cl.
*D01H 13/32* (2006.01)
*B65H 54/70* (2006.01)
*G01R 21/133* (2006.01)

(52) U.S. Cl.
CPC ............. *D01H 13/32* (2013.01); *B65H 54/70* (2013.01); *G01R 21/133* (2013.01)

(58) Field of Classification Search
CPC ........ D01H 13/32; D01H 13/14; D01H 13/00; B65H 63/00; B65H 54/70; G01R 21/133
See application file for complete search history.

(56) References Cited

U.S. PATENT DOCUMENTS

2001/0042365 A1  11/2001  Paweletz et al.
2017/0362746 A1*  12/2017  Stephan ................... D01H 4/44

FOREIGN PATENT DOCUMENTS

CN  102856925 A  1/2013
CN  104233529 A  12/2014
(Continued)

OTHER PUBLICATIONS

English translation of WO2016074767 to Krawietz, obtained via espacenet.com (last visited Sep. 2, 2022) (Year: 2022).*

(Continued)

*Primary Examiner* — Shaun R Hurley
*Assistant Examiner* — Patrick J. Lynch
(74) *Attorney, Agent, or Firm* — Dority & Manning, P.A.

(57) ABSTRACT

A method determines an electrical characteristic at a spinning machine or winder, wherein the electrical characteristic is one or both of electrical power and electrical energy consumption. The spinning machine or winder includes a plurality of adjacently arranged workstations that each include an electrical working element. A total electrical characteristic for the spinning machine or winder is measured with a central measuring unit. The workstations are subdivided into at least two production groups that operated independently of one another. A distribution key is defined and used to calculate the electrical characteristic specific to each of the production groups by allocating the total electrical characteristic to the production groups with the distribution key. The specific production group electrical characteristics are displayed at the spinning machine or winder and transmitted to a computer that is at a higher control level than the spinning machine or winder.

14 Claims, 4 Drawing Sheets

(56) References Cited

FOREIGN PATENT DOCUMENTS

| | | | | | |
|---|---|---|---|---|---|
| CN | 104562328 | A | | 4/2015 | |
| CN | 107217348 | A | * | 9/2017 | ............ D01H 13/32 |
| CN | 109306558 | A | | 2/2019 | |
| CN | 109306558 | B | * | 8/2021 | ............ D01H 13/00 |
| DE | 39 11 850 | A1 | | 10/1990 | |
| DE | 10 2007 053 711 | A1 | | 5/2009 | |
| DE | 10 2013 111 245 | A1 | | 4/2014 | |
| DE | 10 2014 016 785 | A1 | | 5/2016 | |
| DE | 10 2015 014 383 | A1 | | 5/2017 | |
| DE | 10 2017 112 080 | A1 | | 12/2017 | |
| DE | 10 2017 120 714 | A1 | | 3/2019 | |
| EP | 2028298 | A2 | * | 2/2009 | ............... D01H 1/20 |
| EP | 2110470 | A2 | * | 10/2009 | ............... D01H 1/20 |
| EP | 2562114 | A2 | * | 2/2013 | ............ B65H 63/00 |
| EP | 2789717 | A1 | | 10/2014 | |
| JP | 2638894 | B2 | * | 8/1997 | ............ D01H 1/244 |
| JP | 2004183137 | | | 7/2004 | |
| WO | WO-2016074767 | A1 | * | 5/2016 | ............ B65H 54/74 |
| WO | WO-2019048150 | A1 | * | 3/2019 | ............ D01H 13/32 |

OTHER PUBLICATIONS

German Patent Office Search Report, dated Jul. 31, 2020.
EPO Search Report, dated Jan. 27, 2021.
Chinese Office Action, dated Dec. 5, 2022.

\* cited by examiner

METHOD FOR DETERMINING AN ELECTRICAL POWER OR AN ELECTRICAL ENERGY CONSUMPTION OF A SPINNING MACHINE OR WINDER AND A SPINNING MACHINE OR WINDER OPERATING IN ACCORDANCE WITH THE METHOD

FIELD OF THE INVENTION

The present invention relates to a method for determining an electrical power or an electrical energy consumption at a spinning machine or winder, in particular an open-end or air-jet spinning machine, comprising a plurality of adjacently arranged workstations, which each workstation having at least one electrical working element. Moreover, the invention relates to a spinning machine or winder, in particular an open-end or air-jet spinning machine, for carrying out the method, wherein the spinning machine or winder comprises a plurality of adjacently arranged workstations, which each workstation having at least one electrical working element.

BACKGROUND

Spinning machines or winders of the generic type are known in various embodiments from the prior art. For example, DE 39 11 850 A1 describes a ring spinning machine, in the case of which the operating condition of the production stations is determined, in each case, on the basis of the current or power consumption of a certain drive of the particular production station. The drive can be, for example, the spindle motor. In the case of a thread break, the current draw of the spindle motor will drop, while it increases if a thread tension is too high.

DE 10 2007 053 711 A1 describes a cross-wound package-manufacturing spinning machine or winder, in the case of which the motor current for the electric motor-operated drive of the opening roller is monitored, in order to infer the presence of a sliver.

Moreover, DE 10 2015 014 383 A1 relates to a two-for-one yarn twisting or cabling machine, in the case of which the energy consumption of the spindle drive is determined. On the basis of this measurement, the position of the balloon-yarn-guide-eye is adjusted in such a way that a position-dependent, minimum energy consumption of the spindle drive is achieved.

Moreover, DE 10 2013 111 245 A1 describes a rotor spinning machine comprising a single rotor drive, in the case of which the supply current or the power consumption of the drive is monitored. On the basis of changes of the supply current, a thread break or a fault can be detected at the particular workstation during the piecing process.

The electrical values determined in this way exclusively allow for inferences to be drawn regarding processes at individual workstations or at individual drives. In the case of textile machines and, in particular, spinning machines, the overall energy consumption is also of great significance, however, since this substantially influences the production costs.

It is therefore provided in DE 10 2014 016 785 A1 to calculate the total power consumption of the spinning machine or winder, in that the individual values of the power consumptions of the individual drives or their frequency inverters are added. Corrections can also be implemented, which encompass the efficiency of the frequency inverters or certain operating conditions of the drives.

SUMMARY

The problem addressed by the present invention is that of providing a method for determining an electrical power or an electrical energy consumption at a spinning machine or winder, and a spinning machine or winder, which allow for an improved detection of energy consumption or power data. Additional objects and advantages of the invention will be set forth in part in the following description, or may be obvious from the description, or may be learned through practice of the invention.

The problems are solved by a method for determining an electrical power or an electrical energy consumption at a spinning machine or winder, and a spinning machine or winder having the features set forth herein.

A method is provided for determining an electrical power and/or an electrical energy consumption at a spinning machine or winder, in particular an open-end or air-jet spinning machine, comprising a plurality of adjacently arranged workstations, each of which comprises at least one electrical working element. In the method, a total electrical power of the spinning machine or winder is determined.

The workstations are usually workstations of the same kind. The working elements of the workstations can each be driven with the aid of a workstation-specific single drive as well as in groups with the aid of a central drive, as is known from the prior art. Moreover, the workstations can comprise consumers, which consume electrical energy but are not driven.

In order to determine the electrical power and/or the electrical energy consumption, it is provided that the workstations are subdivided into at least two production groups, which can be operated independently of one another, and the total electrical power and/or a total electrical energy consumption of the spinning machine or winder are/is measured with the aid of a first, central measuring unit. Moreover, a distribution key is predefined and a production group power and/or a production group energy consumption are/is calculated for each of the production groups, in that the total electrical power and/or the total electrical energy consumption of the spinning machine or winder are/is allocated to the individual production groups with the aid of the distribution key. The production group power and/or the production group energy consumption are/is displayed at the spinning machine or winder and/or transmitted to a computer that is at a higher level than the spinning machine or winder.

A production group is understood to be a group of workstations of a spinning machine or winder, which each manufacturing or winding the same product with respect to the yarn parameters and, in the process, operate independently of other production groups.

With the aid of the method, it is not only possible to determine the present total power or the total energy consumption of the spinning machine or winder. Rather, it is additionally also possible to determine the instantaneously consumed production group power or the production group energy consumption individually for each production group. This is essential, since different yarns having different yarn parameters also require different settings at the workstations. Accordingly, considerable differences can arise with respect to the power consumption or the energy consumption of the individual production groups. The electrical power indicates the present operating condition of the particular production group. Due to the determination of the production group power and/or the production group energy consumption, the settings for the manufacture of the particular product can be optimized in a production group-specific manner. In addition, faults can be detected, which occur only in one certain production group, for example, due to the yarn characteristics or the adjusting parameters. In addition, the costs for the production of the yarn produced in the particular production group can be precisely determined as a result.

The determination of the total power and/or the total energy consumption of the spinning machine or winder as well as the calculation of the production group power and/or the production group energy consumption can take place in a particularly precise manner with the aid of the method provided, since not only are the power and/or energy data of the working elements of the workstations determined, as in the prior art, but rather the power and/or the energy consumption of higher-order drives and further electrical consumers are/is also taken into account. This takes place according to the method due to the fact that the total electrical power of the spinning machine or winder is measured. In addition, the production group power is not determined merely by adding the powers of the drives of this production group, but rather is precisely calculated, in that the total power of the spinning machine or winder is proportionally allocated to the individual production groups with the aid of the distribution key. The same applies, in a similar way, for the determination of the total energy consumption and the calculation of the production group energy consumption. Due to the display and/or the transmission of the production group power and/or the production group energy consumptions to a higher-order computer, the operating personnel is quickly informed about the operating condition and/or the efficiency of the spinning machine or winder and its production groups and can carry out service tasks at the spinning machine or winder or adapt parameters. Due to the transmission to a higher-order computer, the data can also be analyzed or centrally stored and can be compared to data of other spinning machines or winders.

Moreover, an appropriate spinning machine or winder, in particular an open-end or air-jet spinning machine, is provided. The spinning machine or winder comprises a first, central measuring unit for measuring a total power or a total energy consumption of the spinning machine or winder as well as a control unit for carrying out the method. In order to display the production group power and/or the production group energy consumption, the spinning machine or winder preferably comprises at least one display unit, which is connected to the control unit. The display unit can be located in the particular production group or can also be centrally arranged at the spinning machine or winder.

With respect to the method, it is advantageous when a specific energy consumption is determined in kW/g yarn or in kW/m yarn for each of the production groups and/or for the entire spinning machine or winder. The specific energy consumption provides information regarding the energy consumption and/or the costs for the production of a certain yarn and allows inferences to be drawn regarding the efficiency of the production group or also the entire spinning machine or winder. The specific energy consumption can be determined with the aid of the delivery speed and, if necessary, further parameters from the production group power or the production group energy consumption. Preferably, the specific energy consumption is also displayed at the spinning machine or winder and/or transmitted to a computer that is at a higher level than the spinning machine or winder.

According to a first advantageous embodiment of the method, the measured total electrical power and/or the measured total electrical energy consumption are/is allocated to the individual production groups according to the number of actively operating workstations. In order to determine the production group power, the measured total power of the spinning machine or winder is divided by the total number of actively operating workstations and, as a result, a power per workstation is determined. This is then multiplied by the number of workstations of the particular production group and, therefore, the production group power is determined as a proportion of the particular production group with respect to the total power. This also applies, of course, in a similar way, for the determination of the production group energy consumption.

Actively operating workstations are workstations that are being operated or are presently in a regular service cycle, such as a piecing cycle or a package change cycle. Workstations that are defective or switched off or that have encountered faults are therefore not actively operating workstations.

According to one alternative embodiment of the method, the measured total electrical energy consumption is allocated to the individual production groups according to the number of piecing operations within a certain period. In order to determine the production group energy consumption, the measured total electrical energy consumption of the spinning machine or winder is divided by the total number of piecing operations within the certain period and, as a result, an energy consumption per piecing operation is determined. This is then multiplied by the number of piecing operations of the particular production group and, therefore, the production group energy consumption is determined as a proportion of the particular production group with respect to the total energy consumption. This is also feasible, in a similar way, for the determination of the production group power. Since piecing operations are particularly energy-intensive, the number of piecing operations is a particularly well-suited parameter for determining the production group energy consumption. It is also advantageous that certain yarn properties are often also reflected in the number of piecing operations. By carrying out the allocation with respect to the number of piecing operations, a slightly more precise allocation of the total energy consumption or the total power to the individual production groups can therefore take place. According to another advantageous embodiment of the method, an electrical power and/or an electrical energy consumption of the working elements of the workstations of the particular production group are/is determined for each of the production groups, and the electrical powers determined in this way are expressed as a ratio with respect to one another. Finally, a production group power and/or a production group energy demand are/is calculated for each of the production groups, in that the measured total electrical power and/or the measured total electrical energy consumption of the spinning machine or winder is allocated to the individual production groups according to the ratio of the determined powers and/or energy consumptions of the working elements of the production groups. As a result, a particularly precise determination of the production group power and/or the production group energy demand can take place.

It is advantageous for the measurement of the total electrical power of the spinning machine or winder when the first central measuring unit is designed as a power measuring module. Such power measuring modules can be fixedly installed in the spinning machine or winder and can directly measure the power consumption of the entire spinning machine or winder.

In order to measure the total electrical power and/or the total electrical energy consumption, it is advantageous, furthermore, when the first, central measuring unit is arranged in the area of a mains connection of the spinning machine or winder. As a result, it can be ensured that the total power and/or the total energy consumption of the spinning machine or winder, i.e., of all consumers associated with the spinning machine or winder, are/is also actually detected.

According to one refinement of the method, a production group encompasses the workstations of one longitudinal side of the spinning machine or winder. As a result, two production groups that are independent of one another can also be implemented at machines comprising centrally driven working elements.

It is particularly advantageous when the electrical working elements of the workstations belonging to one production group are driven by a common, central drive.

If a production group encompasses one longitudinal side of the spinning machine or winder in each case, a separate central drive is provided for each longitudinal side, which then drives all workstations of this longitudinal side or this production group. If multiple, dissimilar working elements are present at each of the workstations, identical working elements of the workstations of one longitudinal side are preferably all driven with the aid of a separate central drive. It is also conceivable, of course, that two or even more production groups are provided at one longitudinal side and a separate central drive is provided for each production group or, in the case of multiple, dissimilar working elements, multiple central drives arranged, for example, in intermediate frames, are also provided for each production group. Moreover, it is advantageous when the power and/or the energy consumption of the working elements of one production group are/is measured by one further measuring unit associated with the particular production group. For this purpose, the spinning machine or winder comprises at least one further measuring unit for measuring a power and/or an energy consumption of the working elements of a production group. The power and/or the energy consumption of the working elements of the production group can be easily directly detected, in this way, at the drives or their wiring harnesses, in particular when the electrical working elements of a production group are driven by one or multiple common, central drive(s).

Therefore, it is also advantageous when the at least one further measuring unit associated with the particular production group is designed as a slip-over transformer. Slip-over transformers can be easily and flexibly placed around a power cable and measure the power consumption and/or the energy consumption of the portion of the spinning machine or winder that is supplied by this power cable. Therefore, they are suitable, in particular, for spinning machines or winders, in the case of which the working elements of the workstations are driven by central drives.

According to another embodiment of the spinning machine or winder, it is also advantageous, however, when the workstations are designed as at least partially autonomous workstations, wherein the at least one working element is driven with the aid of a single drive. With respect to the method, it is therefore advantageous when the at least one electrical working element of each workstation is driven by a workstation-specific single drive. As a result, it is possible to subdivide the workstations into different production groups in any way completely independently of their arrangement within the spinning machine or winder. In addition, the number of production groups can also be established in any way.

With respect to the method, it is advantageous when the subdivision of the workstations into production groups takes place in a dynamically fluctuating manner. As a result, a new lot can be started or a new product can be manufactured immediately after the completion of a lot, for example, at one workstation. The workstation can be associated with a new production group, without the need to wait for the completion of the lot of the further workstations belonging to the original production group.

Moreover, it is advantageous when the power and/or the energy consumption of the working elements of a production group are/is determined, in that the individual powers and/or energy consumptions of the single drives of the workstations belonging to the particular production group are added. The power and/or the energy consumption of the at least one workstation-specific single drive is measured, for this purpose, with the aid of one further measuring unit associated with the single drive. For this purpose, the spinning machine or winder comprises at least one further measuring unit for measuring a power and/or an energy consumption of a workstation-specific single drive. Advantageously, in the case of such a spinning machine or winder comprising individually driven working elements, the at least one further measuring unit is a control unit associated with the single drive, in particular a section control unit. The workstations of spinning machines or winders are usually structurally subdivided into multiple identical sections. The section control unit controls the individual working elements connected thereto directly or forwards at least control data for the working elements and, therefore, can also determine their power and/or energy consumption, even when these belong to different production groups.

Additionally or alternatively, it is also possible, however, that the at least one further measuring unit is designed as an acquisition unit integrated into the single drive, for example, as a control electronics system of the single drive. The integrated acquisition unit can forward the power and/or the energy consumption directly or, if necessary, also via the above-described section control unit to an evaluation unit, which then determines the production group power and/or the production group energy consumption on the basis of the data gathered in this way.

According to one first embodiment of the method, it is advantageous when the production group powers and/or the production group energy consumptions are calculated only at certain time intervals. For example, the production group power can be calculated only at certain, preferably regular, time intervals, which still sufficiently allows for inferences to be drawn regarding the present operating condition of the particular production group or also of the spinning machine or winder but minimizes the computing power and the data traffic. Alternatively, the production group powers and/or the production group energy consumptions can also be continuously calculated, however. The total power and/or the total energy consumption of the spinning machine or winder can also be measured continuously as well as only at certain time intervals. The same also applies for the specific energy consumption.

In addition, the total energy consumption and the production group energy consumptions can be determined in a predefinable or predefined period. These energy data enable inferences to be drawn regarding the efficiency of the production group. The period during which the energy consumption is determined can either be predefined by the user or is fixedly predefined and can be a certain time interval or also the time since a certain event, for example, a machine stoppage or a lot change.

Moreover, it is advantageous when the total power and/or the production group power and/or the total energy consumption and/or the production group energy consumptions and/or the specific energy consumption per production group are/is stored at least at certain time intervals, preferably continuously. For this purpose, the spinning machine or winder is advantageously a memory medium, which is connected to the control unit. As a result, the data regarding the energy consumption and/or the power can also be analyzed at a later point in time and enable inferences to be drawn regarding faults in the process.

Alternatively or additionally, the total power and/or the production group power and/or the total energy consumption and/or the production group energy consumptions and/or the specific energy consumption per production group can be directly displayed to the operator at least at certain time intervals, preferably continuously. For this purpose, the spinning machine or winder preferably comprises at least one display unit connected to the control unit. As a result, the operating personnel is quickly informed about the operating condition and/or the efficiency of the spinning machine or winder and its production groups and can carry out service tasks at the spinning machine or winder or adapt parameters.

It is also advantageous when the total power and/or the production group power and/or the total energy consumption and/or the production group energy consumptions and/or the specific energy consumption are/is transmitted to a computer, which is at a higher level than the spinning machine or winder, at certain time intervals, preferably continuously. For this purpose, the spinning machine or winder, in particular its control unit, advantageously comprises a device for data transmission. The data can then be analyzed or centrally stored, so that the data is also available for subsequent analyses and comparisons with other spinning machines or winders and can be compared to data of other spinning machines or winders.

Moreover, for the display of the total power and/or the production group powers and/or the total energy consumption and/or the production group energy consumption and/or the specific energy consumption, it is advantageous when this/these is/are displayed as an instantaneous value, in particular numerically. Alternatively, an instantaneous value could also be displayed graphically, for example, by way of the height of a bar. Alternatively or additionally, can a display as a time-dependent graph is also possible, however. A time window of the time-dependent graph is preferably rolling or begins at a predefinable and/or predefined point in time. The display as a time-dependent graph also makes it possible to track the development of the data in the time window, wherein changes can indicate a possible malfunction of the production group.

BRIEF DESCRIPTION OF THE DRAWINGS

Further advantages of the invention are described with reference to the following exemplary embodiments. Wherein.

DETAILED DESCRIPTION

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

In the following description of the figures, identical reference numbers are utilized for features that are identical or at least comparable in each of the individual embodiments or the individual figures. Some of the features are therefore explained only upon the first mention thereof or only once with reference to a suitable figure. Provided these features are not explained once more separately in connection with the further features, their design and/or mode of operation correspond(s) to the design and mode of operation of the identical or comparable, described features. Moreover, in the case of multiple identical features or components in a figure, only one feature or only a few of these identical features is/are labeled, for the sake of clarity.

Figure 1:
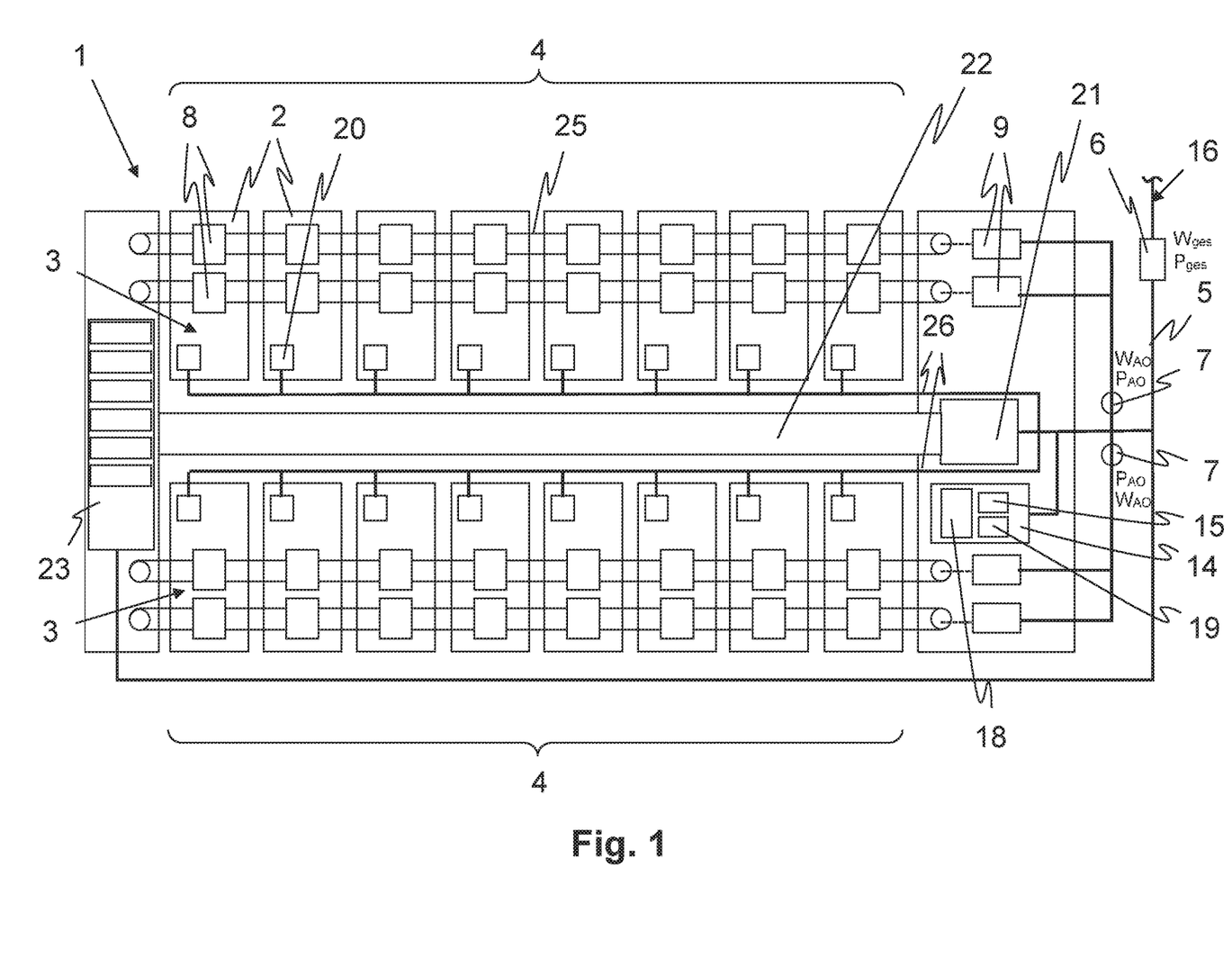
FIG. 1 shows a schematic top view of a spinning machine or winder according to a first embodiment.

FIG. 1 shows a top view of a spinning machine or winder 1 comprising a plurality of workstations 2. Usually, the number of workstations 2 will be much greater than that represented in FIG. 1. The spinning machine or winder 1 can be any type of spinning machine or winder 1 comprising a plurality of identical workstations 2, in particular, however, an open-end or air-jet spinning machine. The workstations 2 are arranged on two longitudinal sides 3 of the spinning machine or winder positioned opposite one another.

Each of the workstations 2 comprises at least one electrical working element 8 for producing and/or winding a yarn. Usually, each workstation 2 comprises multiple, dissimilar working elements 8. In the case of a rotor spinning machine, these encompass, for example, a feed device, an opening unit, a spinning device, a take-off device, and a winding device. Identical working elements 8 of the workstations 2 of one longitudinal side 3 are all driven with the aid of a separate, central drive 9, as represented in the present case. Two different electrical working elements 8 are represented at each of the workstations 2 in the present case, and so two central drives 9 are therefore shown on each longitudinal side. Each of these drives 9 acts upon the identical working elements 8 of all workstations 2 of this longitudinal side 3 via a drive means 25, which is as long as the machine. Due to the separate central drives 9 per longitudinal side 3, each longitudinal side 3 of the spinning machine or winder can therefore also form a separate production group 4.

Moreover, the spinning machine or winder 1 also comprises one or multiple, higher-order electrical consumers 20 and/or working elements 8, which fulfill central functions of the spinning machine or winder 1 and are not arranged at the individual workstations 2. Represented here by way of example are a control unit 14, a ventilator drive 21, which supplies the workstations 2 with vacuum via a central vacuum duct 22, and a tube loader 23, which supplies the individual workstations 2 with the solution. Further such higher-order working elements 8 or electrical consumers 20 would be, for example, package conveyor belts, tube conveyor belts, trash conveyor belts, and the like.

The spinning machine or winder 1 is supplied with electrical energy via a mains connection 16 and a power cable 5. The higher-order, electrical consumers are directly connected to the power cable 5. The workstations 2 are supplied via wiring harnesses 26 connected to the power cable 5, wherein, in the present example, a separate wiring harness 26 is provided at each longitudinal side 3 of the spinning machine or winder 1, and so the two longitudinal sides 3 can be supplied separately from one another.

The workstations 2 can also comprise further electrical consumers 20, which are not driven, however. Examples thereof would be a yarn clearer or a display at the workstations 2. These can be connected, depending on the model, either to the individual wiring harnesses 26 or also, as represented in the present case, to the power cable 5 for the entire spinning machine or winder 1.

A first measuring unit 6 is associated with the power cable 5 for the entire spinning machine or winder 1, which measures the total power consumption Pges of the spinning machine or winder 1. The first measuring unit 6 is therefore preferably designed as a power measuring module. Due to the measurement of the actual total power consumption Pges, higher-order consumers 20 and working elements 8 are now also measured. By comparison, in the prior art, in order to determine the total power Pges of the spinning machine or winder 1, the individual powers of the working elements 8 of the workstations were merely added, whereby the powers of the higher-order consumers 20 and working elements 8 were neglected.

Moreover, one further measuring unit 7 is associated with each of the two wiring harnesses 26 of the two machine sides 3 in the present case. The further measuring unit 7 can be designed, for example, as a slip-over transformer and placed directly over the particular wiring harness 26. With the aid of the further measuring unit 7, the power PAO of all working elements 8 (and, possibly, consumers 20) of the production group 4 that are connected to the particular wiring harness 26 can be measured. This power PAO of the working elements 8 of the workstations 2 of the particular production group 4 does not correspond to the actual production group power PPG, however, since, as described above, the powers of the higher-order working elements 8 and consumers 20 are lacking.

In order to now calculate the actual production group power PPG for each of the two production groups 4, the measured powers PAO of the working elements 2 of each production group 4 are therefore expressed as a ratio with respect to one another, and the total power Pges of the spinning machine or winder 1 is allocated to the individual production groups 4 according to the ratio of the determined powers PAO of the working elements 8 of the production groups 4. This is to be illustrated with the aid of a numeric example: A total power Pges, for example, of the spinning machine or winder of 100 kW is measured with the aid of the first measuring unit 6. Moreover, with the aid of the two further measuring units 7, a power PAO of 70 kW is measured for the first wiring harness 26 and, therefore, the working elements 8 of the first production group 4, and a power PAO of 20 kW is measured for the second wiring harness 26 of the second production group 4. The ratio of the electrical powers PAO of the working elements 8 of the two production group 4 is therefore 7:2. The measured total power Pges is now allocated to the two production groups 4 precisely in the ratio 7:2, i.e., 7/9 of the measured total power Pges of 100 kW are applied to the first production group 4 and 2/9 to the second production group 4. The production group power PPG for the first production group 4, which is calculated in this way, is therefore 7/9×100 kW=77.7 kW and for the second production group 4, therefore, 2/9×100 kW=22.2 kW. Due to this calculation of the production group power 4, the power consumption of the particular production group 4 can therefore be determined substantially more precisely than with the aid of a single measurement of the power of the working elements 8 of the particular production group 4.

Similarly, a production group energy consumption WPG can also be calculated, of course, in that a total energy consumption Wges of the spinning machine or winder 1 is measured and is allocated according to the ratio of the measured or determined energy consumptions WAO of the working elements 8 of the production groups 4.

The values measured by the first measuring unit 6 and the further measuring units 7 are fed to an evaluation unit 15, which is provided within the control unit 14 of the spinning machine or winder 1 in the present case. Of course, the evaluation unit 15 could also be provided in the spinning machine or winder 1 independently of the control unit 14, however, or could also be fed to a computer, which is at a higher level than the spinning machine or winder 1, with the aid of a device for data transmission. The production group powers PPG and/or the production group energy consumptions WPG are calculated with the aid of the evaluation unit 15.

In the present case, a memory medium 19 is also provided in the control unit 14 of the spinning machine or winder 1, in which the power and/or energy data measured with the aid of the measuring units 6, 7 as well as the production group powers PPG and production group energy consumptions WPG can be stored. The memory medium 19 is suitable, at least, for the temporary, preferably also for the long-term storage of data. A temporary storage is necessary, for example, for the display of data, while a long-term storage is advantageous for a more detailed analysis or retrospective calculations, for example, in order to optimize the operation of the spinning machine or winder 1 or in order to obtain additional information for the search for a fault that occurred at the spinning machine or winder 1.

Moreover, according to the present example, the control unit 14 comprises a display unit 18, with the aid of which at least the calculated production group powers PPG or the production group energy consumptions WPG can be displayed. Of course, the further power and/or energy data can also be displayed in alternation and/or on demand, if necessary.

Figure 2:
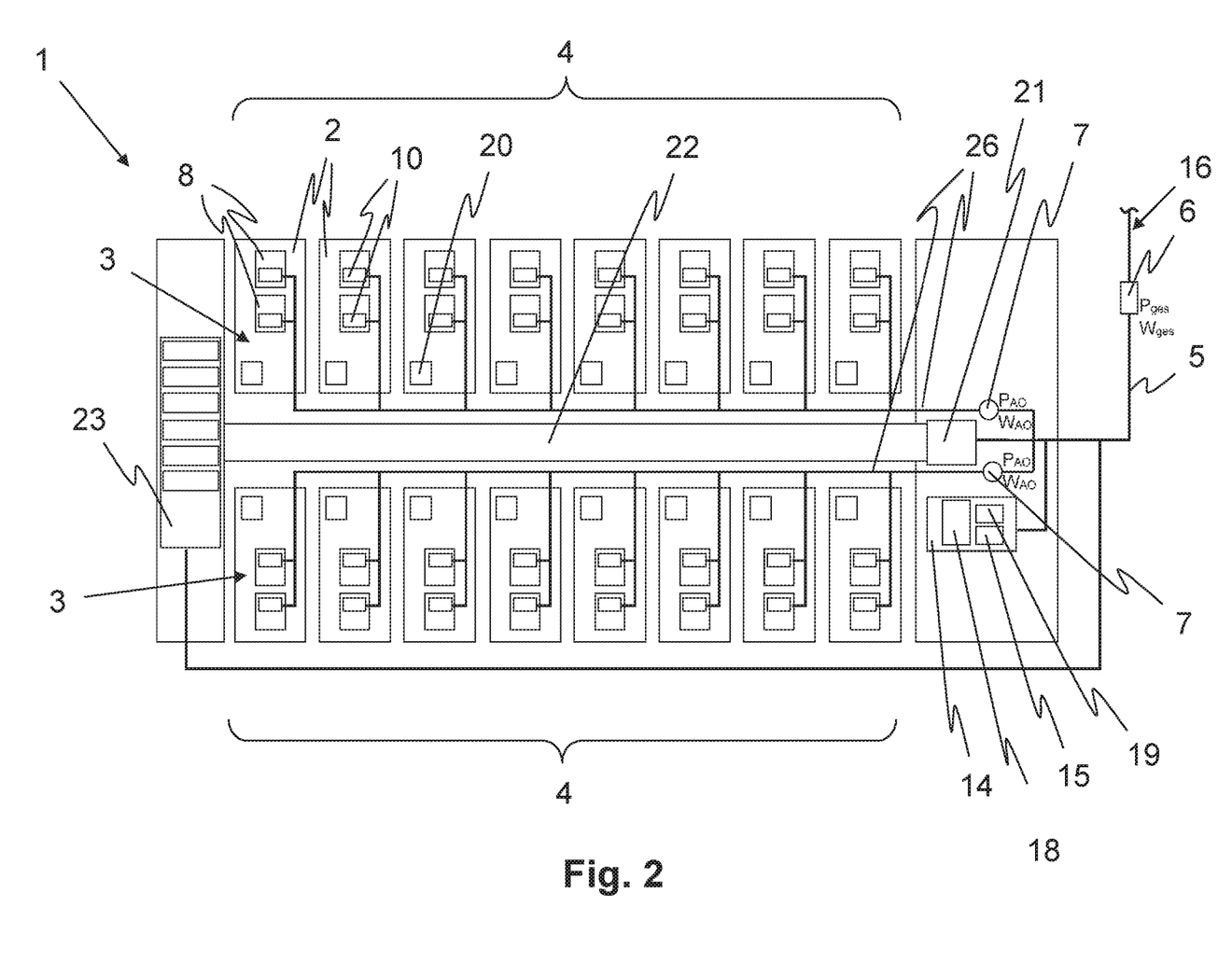
FIG. 2 shows a schematic top view of a spinning machine or winder according to a second embodiment.

FIG. 2 shows another embodiment of a spinning machine or winder 1, in the case of which the working elements 8 of the workstations 2 are not driven with the aid of central drives 9, but rather with the aid of a workstation-specific single drive 10 in each case. As described above, each production group 4 comprises the workstations 2 of one longitudinal side 3 of the spinning machine or winder 1 in this exemplary embodiment as well, however. All working elements 8 of the workstations 2 of a production group 4 are connected to a wiring harness 26 and are jointly supplied via the wiring harness 26. It is also possible in this case to measure the electrical power PAO of the working elements 8 of a production group 4 with the aid of further measuring units 7 arranged at the wiring harnesses 26. The calculation of the production group powers PPG and/or the production group energy consumptions WPG therefore takes place as described with reference to FIG. 1.

It is understood that embodiments are also possible, in which a portion of the working elements 8 is driven with the aid of central drives 9 and another portion of the working elements 8 is driven with the aid of single drives 10. Likewise, a production group 4 could also comprise only a portion of a longitudinal side 3. When the working elements 8 of a production group 4 are each supplied via a separate wiring harness 26 associated with this production group 4, the measurement and calculation of the aforementioned energy and power data can nevertheless take place as described.

Figure 3:
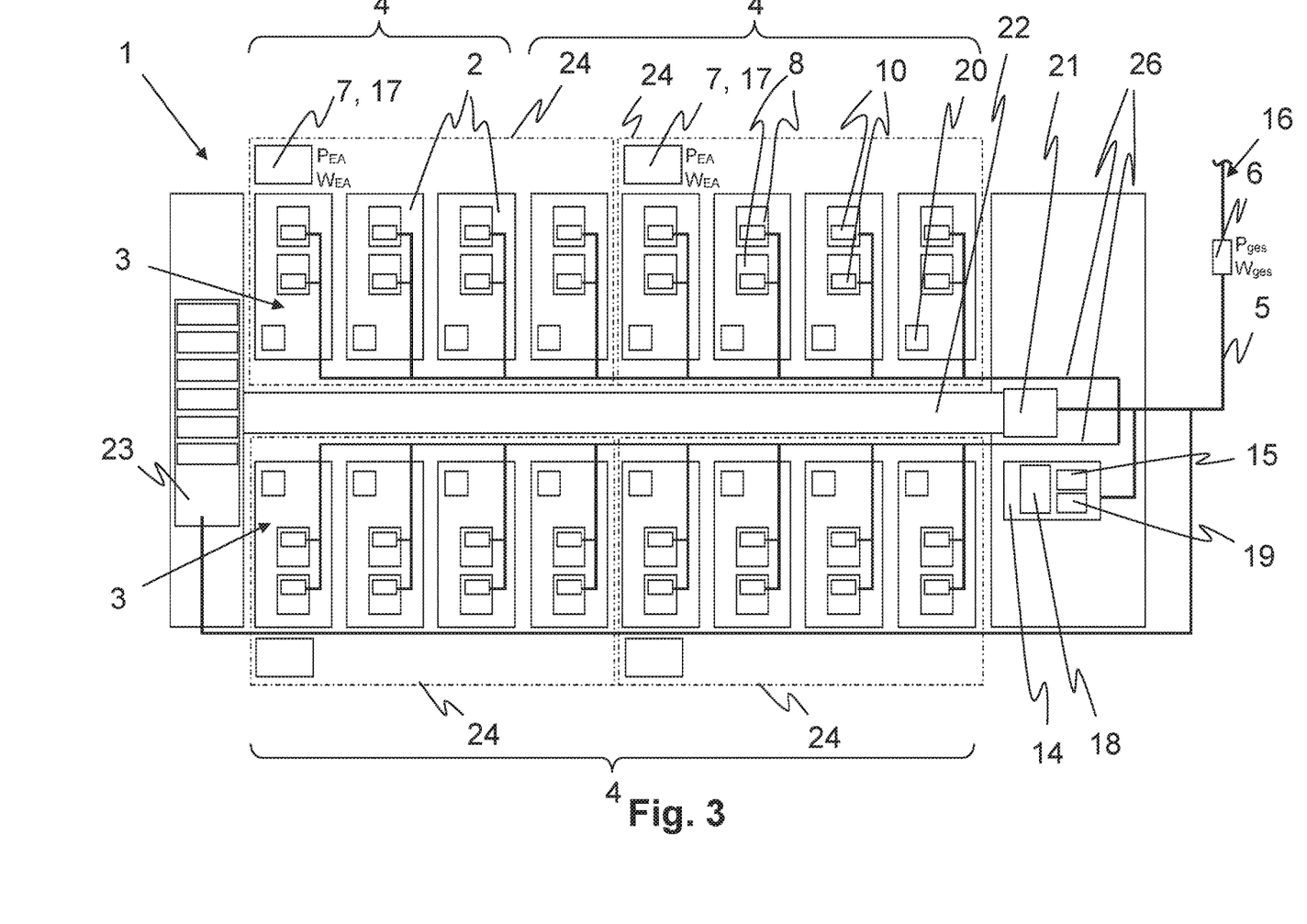
FIG. 3 shows a schematic top view of a spinning machine or winder according to a third embodiment.

FIG. 3 shows another embodiment of a spinning machine or winder 1, in the case of which the working elements 8 are driven with the aid of single drives 10. The workstations 2 are structurally subdivided into sections 24, as is common for spinning machines or winders 1. The workstations 2 are designed as autonomous workstations 2 in the present case, which can be operated completely independently of other workstations 2, also independently of those of the same section 24. Each section 24 comprises a section control unit 17, which controls the various single drives 10 with the aid of control data or forwards this type of control data to the various single drives 10.

Since the individual workstations 2 can be operated independently of other workstations 2, the workstations 2 can also be subdivided into various production groups 4 in any way and independently of the structural subdivision into sections 24. It is also not necessary, in this case, that the individual workstations 2 associated with the single, one production group 4 are adjacent to one another.

The measurement of the total power Pges takes place with the aid of the first measuring unit 6, as described above. The measurement of the power PAO of the working elements 8 of the workstations 2 of a production group 4 is not possible, however, due to the random assignment of the workstations 2 to the various production groups. The power PAO of the working elements 8 of a production group 4 is therefore determined, in that the individual powers PEA of the single drives 10 are determined or measured and are added to one another. For example, the powers PEA of the single drives 10 can be measured with the aid of acquisition units integrated into the single drives 10. It is also possible to determine the powers PEA of the single drives 10 on the basis of control data of the single drives 10, for example, with the aid of the section control units 17. The section control units 17 each form, in this case, one further measuring unit 7, which is associated with multiple single drives 10 and, as a result, at least temporarily also with one or multiple production group(s) 4 in each case.

In order to calculate the production group powers PPG, the powers PAO of the working elements 8 of the production groups 4 are then expressed as a ratio with respect to one another, and the measured total power Pges is allocated to the production groups 4 according to this ratio. This is also explained with reference to a numeric example: For example, a total power Pges of the spinning machine or winder of 100 kW is measured with the aid of the first measuring unit 6. Moreover, the individual powers of the single drives PEA of a production group 4, which are made available by the section control units 17 in the present case, are added to a power PAO of 30 kW for the first production group 4, to a power PAO of 40 KW for the second production group, and to a power PAO of 20 KW for the third production group. The power of all working elements 8 of all production groups 4 is therefore only 90 kW.

Now the ratio of the electrical powers PAO of the working elements 8 of the production groups 4 is formed, which is 3:4:2 in the present case. The measured total power Pges is now allocated to the three production groups 4 in the ratio 3:4:2, i.e., 3/9 of the measured total power Pges of 100 kW are applied to the first production group 4, 4/9 of the total power Pges are applied to the second production group 4, and 2/9 are applied to the third production group. The production group power PPG, which is calculated in this way, is therefore 33.3 kW for the first production group 4, 44.4 kW for the second production group 4, and 22.2 kW for the third production group 4.

Additionally or alternatively, a production group energy consumption WPG is also calculated in a similar way.

As represented in the following with reference to FIGS. 4 and 5, the display of the electrical power and/or energy consumption data can take place in various ways with the aid of the display unit 18.

Figure 4:
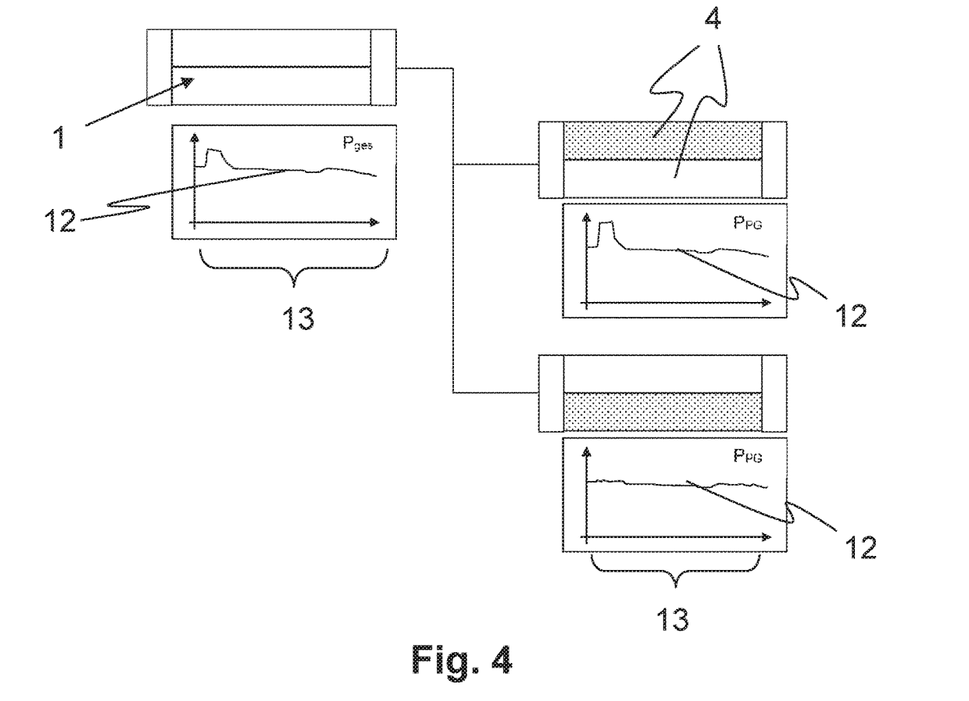
FIG. 4 shows a schematic representation of a display of power and/or energy consumption data according to a first embodiment.

FIG. 4 shows a first embodiment, in which the total electrical power Pges of the spinning machine or winder 1 as well as the production group powers PPG are represented as a time-dependent graph 12. The progression of the powers Pges and PPG over time is therefore represented within a certain time window 13.

The spinning machine or winder 1 shown in the present case comprises only two production groups 4, whose production group powers PPG are represented together with the total power Pges on a screen in the present case. In order to be able to assign the individual production group powers PPG to the particular production groups 4, the particular represented production group 4 is appropriately marked in the representation, in the present case with the aid of dots. Of course, multiple production groups 4 could also be jointly represented in a similar way. It is also conceivable that a display takes place only on demand and, for example, also in a selectable manner for certain production groups 4.

Figure 5:
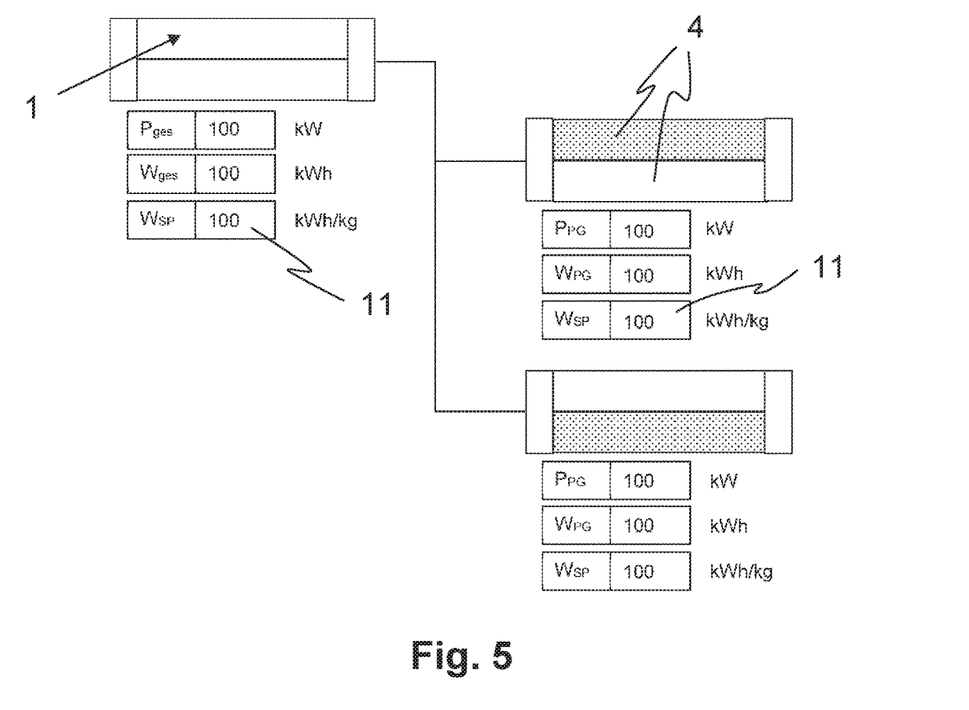
FIG. 5 shows a schematic representation of a display of power and/or energy consumption data according to a second embodiment.

By comparison, in the display from FIG. 5, the total electrical power Pges of the spinning machine or winder 1 and the production group powers PPG are numerically displayed as instantaneous values 11. The particular represented production group 4 is appropriately marked. In the present case, not only are the total electrical power Pges and the production group powers PPG represented, but rather the total electrical energy consumption Wges and the production group energy consumptions WPG are additionally displayed as well. In addition, a specific energy consumption WSP for each of the production groups 4 as well as for the entire spinning machine or winder 1 were also calculated and displayed in the present example.

Due to the display of the production group powers PPG and the specific energy consumptions WSP for each production group 4, the operating personnel can very quickly draw inferences regarding faults in the process or also regarding the quality of the produced yarn and, if necessary, initiate appropriate countermeasures, for example, service tasks or adjustment optimizations.

Preferably, the operating personnel can select whether the display should take the form of a graph 12 or an instantaneous numeric value 11. The display unit 18 also does not need to be arranged at a machine end of the spinning machine or winder 1, but rather can be located at another point of the spinning machine or winder 1, for example, close to a production group 4, or off the spinning machine or winder 1, in a control room.

Only the powers as well as only the energy consumptions can be calculated and/or displayed in this case. A combined display, such as that shown in FIG. 5, can also take place, however. It is also conceivable, however, to switch from the calculation of the powers to the calculation of the energy consumptions, and vice versa, temporarily or per the selection of the operator, which also applies for the display of the determined energy consumptions or powers.

The present invention is not limited to the represented and described exemplary embodiments. It is by no means necessary, for example, to take all central drives 9 or all single drives 10 of various working elements 8 into account in the determination of the powers PAO of the working elements 8 of a production group 4. Since the determination of the powers PAO is utilized merely to determine a distribution key for the total power Pges onto the individual production groups 4, it is also possible to determine only the powers PAO of certain working elements 8 that are characteristic for the power and/or the energy consumption at the workstations. For example, in the case of a rotor spinning machine, only the rotor drives could be utilized for determining the power PAO of the working elements 8 of a production group 4. This applies for centrally driven working elements 8 as well as for individually driven working elements 8. Further modifications are also possible within the scope of the claims.

LIST OF REFERENCE NUMBERS 1 spinning machine or winder
2 workstation
3 longitudinal side of the spinning machine or winder
4 production group
5 power cable
6 first measuring unit
7 further measuring unit
8 electrical working element
9 central drive
10 single drive
11 instantaneous value
12 graph
13 time window
14 control unit
15 evaluation unit
16 mains connection
17 section control unit
18 display unit
19 memory medium
20 consumer
21 ventilator drive
22 vacuum duct
23 tube loader
24 section
25 drive means
26 wiring harness
Pges total electrical power
Wges total electrical energy consumption
PAO electrical power of the working elements of a production group
WAO electrical energy consumption of the working elements of a production group
PEA electrical power of a single drive
WEA energy consumption of a single drive
PPG production group power
WPG production group energy consumption
WSP specific energy consumption

The invention claimed is:

1. A method for determining an electrical characteristic at a spinning machine or winder, wherein the electrical characteristic is one or both of electrical power and electrical energy consumption, the spinning machine or winder comprising a plurality of adjacently arranged workstations that each include at least one electrical working element, the method comprising:
   measuring a total electrical characteristic for the spinning machine or winder with a central measuring unit;
   subdividing the workstations into at least two production groups, wherein each production group comprises a group of the workstations configured to produce a product having common yarn parameters such that different production groups produce different respective products having different yarn parameters, the production groups being operated independently of one another;
   defining a distribution key as a ratio distribution based on the electrical characteristic of the electrical working elements operating within each respective production group;
   calculating the electrical characteristic specific to each of the production groups by allocating the total electrical characteristic between the production groups based on the ratio distribution of the distribution key; and
   performing one or both of: displaying the production group electrical characteristic specific to each production group at the spinning machine or winder; or transmitting the electrical characteristic specific to each production group to a computer that is at a higher control level than the spinning machine or winder.

2. The method as in claim 1, wherein a specific electrical energy consumption (WSP) is determined for each of the production groups and for the spinning machine or winder in total and displayed at the spinning machine or winder.

3. The method as in claim 1, wherein the distribution key is based on a number of actively operating workstations in each of the production groups.

4. The method as in claim 1, wherein the distribution key is based on a number of piecing operations at each of the production groups within a defined time period.

5. The method as in claim 1, wherein for each production group, the electrical characteristic of the working elements are measured by a further measuring unit associated with the production group.

6. The method as in claim 1, wherein the at least one electrical working element of each workstation is driven by a workstation-specific single drive.

7. The method as in claim 6, wherein the electrical characteristic of the workstation-specific single drive is measured with a further measuring unit associated with the single drive, and wherein for each production group, the electrical characteristic of the workstation-specific single drives for the workstations in the production group are added and used to define the distribution key.

8. The method as in claim 1, wherein one or more of (1) the total electrical characteristic, (2) the specific production group electrical characteristics, and (3) a specific electrical energy consumption (WSP) for each production group are displayed at the spinning machine or winder and transmitted to and stored at the computer at defined time intervals or continuously.

9. The method as in claim 1, wherein one or more of (1) the total electrical characteristic, (2) the specific production group electrical characteristics, and (3) a specific electrical energy consumption (WSP) for each production group are displayed at the spinning machine or winder as an instantaneous numeric value or as a time-dependent graph.

10. A spinning machine or a winder, comprising:
a plurality of adjacently arranged workstations, each of the workstations comprising at least one electrical working element;
the workstations subdivided into at least two production groups, wherein each respective production group comprises a group of the workstations configured to produce a same product having same yarn Parameters such that different production groups produce different products, wherein the production groups are that operated independently of one another;
a central measuring unit disposed to measure a total electrical characteristic of the spinning machine or winder, wherein the electrical characteristic is one or both of electrical power and electrical energy consumption; and
a control unit configured to perform the following:
define a distribution key as a ratio distribution based on the electrical characteristic of the electrical working elements operating within each respective production group;
calculate the electrical characteristic specific to each production group by allocating the total electrical characteristic between the production groups based on the ratio distribution of the distribution key; and
display the production group electrical characteristic specific to each production group at the spinning machine or winder, or transmit the electrical characteristic specific to each production group to a computer that is at a higher control level than the spinning machine or winder.

11. The spinning machine or winder as in claim 10, wherein the central measuring unit comprises a power measuring module operably configured at a mains connection of the spinning machine or winder.

12. The spinning machine or winder as in claim 10, further comprising at least one further measuring unit for each production group operably configured to measure the electrical characteristic of workstation-specific single drives in the production group or the working elements in the production group.

13. The spinning machine or winder as in claim 12, wherein the further measuring unit is integrated with a controller associated with each workstation-specific single drive or is an acquisition unit integrated into each workstation-specific single drive.

14. The spinning machine or winder as in claim 10, wherein the workstations are configured as at least partially autonomous workstations, wherein the at least one working element is driven by a single drive specific to the workstation.

* * * * *